United States Patent
Omae et al.

(10) Patent No.: US 9,888,613 B2
(45) Date of Patent: Feb. 6, 2018

(54) POWER MODULE FOR ELECTRIC POWER STEERING AND ELECTRIC POWER STEERING DRIVE CONTROL APPARATUS USING THE SAME

(75) Inventors: Katsuhiko Omae, Chiyoda-ku (JP); Yoshihito Asao, Chiyoda-ku (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 188 days.

(21) Appl. No.: 13/817,236

(22) PCT Filed: Apr. 25, 2011

(86) PCT No.: PCT/JP2011/060056
§ 371 (c)(1),
(2), (4) Date: Feb. 15, 2013

(87) PCT Pub. No.: WO2012/060123
PCT Pub. Date: May 10, 2012

(65) Prior Publication Data
US 2013/0141871 A1    Jun. 6, 2013

(30) Foreign Application Priority Data
Nov. 2, 2010 (JP) ................................ 2010-246306

(51) Int. Cl.
*H02K 7/20* (2006.01)
*H05K 7/20* (2006.01)
(Continued)

(52) U.S. Cl.
CPC ......... *H05K 7/2039* (2013.01); *B62D 5/0406* (2013.01); *B62D 5/0409* (2013.01);
(Continued)

(58) Field of Classification Search
USPC ........................................................ 361/709
See application file for complete search history.

(56) References Cited

U.S. PATENT DOCUMENTS 6,215,681 B1 * 4/2001 Schuurman ........... H02M 7/003
174/70 C
6,333,617 B1 * 12/2001 Itabashi ................... H02P 7/04
318/599
(Continued)

FOREIGN PATENT DOCUMENTS

CN    1836328 A    9/2006
EP    2 298 622 A1    3/2011
(Continued)

OTHER PUBLICATIONS

Communication dated Oct. 7, 2014, issued by the Japanese Patent Office in counterpart Application No. 2012541762.
(Continued)

*Primary Examiner* — Eduardo Colon Santana
*Assistant Examiner* — Said Bouziane
(74) *Attorney, Agent, or Firm* — Sughrue Mion, PLLC; Richard C. Turner

(57) ABSTRACT

An object is to release heat efficiently to heat-resistance abilities of individual components by enhancing a heat-radiation performance of power circuit components forming a power module (100) and by enhancing a heat generation balance. The power circuit components formed of power switching elements (107 and 108) forming a bridge circuit and a motor relay switching element (109) are mounted on conductive members (102) while a heat generation balance is maintained. Then, the conductive members (102) are disposed on a heat-releasing heat sink (30) by abutment, and the power circuit components and the heat sink (30) are integrally molded using mold resin (101).

15 Claims, 7 Drawing Sheets

(51) Int. Cl.

| | | |
|---|---|---|
| B62D 5/04 | (2006.01) | |
| H02K 5/22 | (2006.01) | |
| H02K 7/116 | (2006.01) | |
| H02M 7/00 | (2006.01) | |
| H01L 23/00 | (2006.01) | |
| H02K 11/33 | (2016.01) | |
| H02P 29/68 | (2016.01) | |
| H01L 23/48 | (2006.01) | |
| H01L 23/498 | (2006.01) | |
| H02M 7/797 | (2006.01) | |
| H02K 9/22 | (2006.01) | |
| H02K 11/02 | (2016.01) | |

(52) U.S. Cl.
 CPC ............ *H01L 24/34* (2013.01); *H02K 5/225* (2013.01); *H02K 7/1166* (2013.01); *H02K 11/33* (2016.01); *H02M 7/003* (2013.01); *H02P 29/68* (2016.02); *H02K 9/22* (2013.01); *H02K 11/024* (2013.01); *H02K 2213/12* (2013.01); *H02M 7/797* (2013.01)

(56) References Cited

U.S. PATENT DOCUMENTS

| | | | | |
|---|---|---|---|---|
| 8,456,049 | B2 * | 6/2013 | Matsuda ............... | B62D 5/0406 180/444 |
| 2002/0060105 | A1 * | 5/2002 | Tominaga ............ | B62D 5/0406 180/443 |
| 2005/0035434 | A1 * | 2/2005 | Fissore ............. | H01L 23/49861 257/666 |
| 2005/0073018 | A1 | 4/2005 | Yano et al. | |
| 2006/0202296 | A1 * | 9/2006 | Yano ................... | H01L 31/0203 257/433 |
| 2007/0246289 | A1 * | 10/2007 | Tominaga ............ | B62D 5/0406 180/444 |
| 2009/0120712 | A1 * | 5/2009 | Kashimoto .......... | B62D 5/0406 180/444 |
| 2009/0250287 | A1 * | 10/2009 | Takashima ........... | B62D 5/0406 180/444 |
| 2009/0272599 | A1 * | 11/2009 | Sekine ................. | B62D 5/0406 180/443 |
| 2010/0049403 | A1 * | 2/2010 | Gillman ................ | H05K 5/064 701/43 |
| 2010/0052449 | A1 * | 3/2010 | Hashimoto .......... | B62D 5/0406 310/91 |
| 2010/0101889 | A1 * | 4/2010 | Yamaguchi .......... | B62D 5/0406 180/444 |
| 2011/0066332 | A1 * | 3/2011 | Sonoda ................ | B62D 5/0406 701/42 |
| 2011/0285336 | A1 * | 11/2011 | Fujita et al. ............. | 318/400.27 |

FOREIGN PATENT DOCUMENTS

| | | | |
|---|---|---|---|
| JP | 6-17249 | U | 3/1994 |
| JP | 7-41164 | Y2 | 9/1995 |
| JP | H09-199645 | A | 7/1997 |
| JP | 2001-267479 | A | 9/2001 |
| JP | 2002-345211 | A | 11/2002 |
| JP | 200432997 | A | 1/2004 |
| JP | 2004-064934 | A | 2/2004 |
| JP | 2005-51031 | A | 2/2005 |
| JP | 2007502544 | A | 2/2007 |
| JP | 2007295658 | A * | 11/2007 |
| JP | 200918668 | A | 1/2009 |
| JP | 2009-027066 | A | 2/2009 |
| JP | 200989491 | A | 4/2009 |
| JP | 2009225612 | A | 10/2009 |
| JP | 2009-278134 | A | 11/2009 |
| JP | 2010-063242 | A | 3/2010 |
| JP | 2010-171463 | A | 8/2010 |
| WO | 2010/007672 | A1 | 1/2010 |

OTHER PUBLICATIONS

International Search Report of PCT/JP2011/060056 dated Jul. 26, 2011.
Communication dated Dec. 2, 2014 from the State Intellectual Property Office of the People's Republic of China in counterpart application No. 201180052045.8.
Communication dated Nov. 4, 2015, issued by the Japanese Patent Office in counterpart Japanese Application No. 2012-541762.
Machine-generated English Translation of JP 2009-278134 A.
Communication dated Sep. 15, 2015 from the Japanese Patent Office issued in corresponding application No. 2014-230427.
Communication dated Mar. 15, 2016 from Japanese Patent Office in counterpart Application No. 2014-230427.
Communication dated Jun. 30, 2015 from the Japanese Patent Office issued in corresponding application No. 2012541762.
English Translation for Asai Shinya "Ten Cardinal Rules of Design for Power Circuit Plane"; Hori Takamasa et al. "New Interunivercity, Power Electronics"; Takeuchi Shigeyuki et al. "Chip on Chip smart MOSFET Technology".
Asai Shinya, Ten Cardinal Rules of Design for Power Circuit Plate, Transistor Technology, Japan, CQ Publishing, Co. Ltd. Jun. 2003, p. 169-171.
Hon Takamasa et al., New Interunivercity, Power Electronics, Japan, Ohm Sha, Nov. 15, 2008, p. 126.
Takeuchi Shigeyuki et al. Chip on chip smart MOSFET Technology, Fuji Electric Journal, Japan, Fuji Electric Holding Co. Ltd. Nov. 10, 2003., vol. 76.
Communication dated Aug. 3, 2016 from the State Intellectual Property Office of the P.R.C. in counterpart Application No. 201180052045.8.
Mitsubishi semiconductor (Intelligent Power module) Catalog No. PS21767 (Aug. 2007).
Communication dated Nov. 8, 2016, from the Japanese Patent Office in counterpart application No. 5970668.
Communication dated May 26, 2017, issued by the State Intellectual Property Office of People's Republic of China in counterpart application No. 201180052045.8, 18 pages with translation.
Communication (The Third Party Observation) dated Oct. 23, 2017, from European Patent Office in counterpart application No. 11837776.1, total of 238 pages with attachments.

* cited by examiner

POWER MODULE FOR ELECTRIC POWER STEERING AND ELECTRIC POWER STEERING DRIVE CONTROL APPARATUS USING THE SAME

CROSS REFERENCE TO RELATED APPLICATIONS

This application is a National Stage of International Application No. PCT/JP2011/060056 filed Apr. 25, 2011, claiming priority based on Japanese Patent Application No. 2010-246306 filed Nov. 2, 2010, the contents of all of which are incorporated herein by reference in their entirety.

BACKGROUND ART

The present invention relates to an electric power steering drive control apparatus that gives an assist force to a vehicle steering gear, for example, by a rotational force of an electric motor, and more particularly, to a power module conducible to enhance heat-releasing efficiency and achieve a size reduction and a cost reduction of a control device controlling driving of an electric motor and to an electric power steering drive control apparatus integrally incorporating the power module.

Conventionally, there is provided a drive apparatus for electric power steering gear including an electric motor that outputs an assist torque to a steering wheel of a vehicle and a control device that controls the driving of the electric motor and configured in such a manner that the control device is attached to the electric motor. Also, a plurality of semiconductor switching elements forming the control device are provided integrally in modules on aboard (see, for example, Patent Document 1 and Patent Document 2).

Patent Document 1 proposes a motor drive apparatus configured in such a manner that various motors, for example, both of a brushed motor and a three-phase brushless motor, can share a plurality of switching elements by providing the switching elements in the form of integrated power modules.

Also, an electric power steering gear of Patent Document 2 reduces a radiation noise and a power loss and achieves a size reduction by fitting a power board on which are mounted heat generating components, such as a plurality of switching elements that control power of an electric motor, to a control board on which are mounted low-current components, such as a micro-computer, in lamination via a circuit case and by firmly attaching the power board to a heat sink also serving as a bracket on a side opposite to an output of a three-phase brushless motor.

In Patent Document 1, however, no consideration is given to a heat-releasing structure for heat generated from the power portion and heat generation in the power module becomes inhomogeneous.

Also, the device of Patent Document 2 improves a heat-radiation performance by laminating the control device on the back surface of the motor. However, the laminated structure causes an increase in size and cost. Also, Patent Document 2 remains silent about a layout and a configuration of power elements to improve thermal efficiency.

Further, with a type having a motor relay switching element that is provided between a plurality of power switching elements forming a bridge circuit and a motor and switches a power supply to the motor ON and OFF, a current about twice as high as that flowing through each power switching element flows through the motor relay switching element. Consequently, a temperature rise of the motor relay switching element becomes correspondingly greater than that of the other switching elements. Hence, heat generation in the power module correspondingly becomes inhomogeneous.

CITATION LIST

Patent Documents

Patent Document 1: Japanese Patent No. 3957177 (JP-A-2004-64934)
Patent Document 2: JP-A-2002-345211

SUMMARY OF THE INVENTION

Problems that the Invention is to Solve

The invention is devised to solve the problems discussed above and has an object to provide a power module for electric power steering capable of achieving a size reduction, a cost reduction, a higher output, and a longer life by enhancing a heat-radiation performance of power circuit components forming a power module and enhancing a heat generation balance to efficiently release heat to heat resistance abilities of individual components, and an electric power steering drive control apparatus using the same.

Means for Solving the Problems

A power module for electric power steering of the invention is characterized in that: power circuit components including a plurality of power switching elements forming a bridge circuit and a motor relay switching element that controls ON and OFF states of motor currents to be supplied to a motor from the respective power switching elements are mounted on conductive members while a heat generation balance is maintained; the conductive members are disposed on a heat-releasing heat sink by abutment; and the power circuit components and the heat sink are integrally molded using mold resin.

Advantages of the Invention

According to the power module of the invention, heat generated from the power circuit components forming the module is balanced evenly. It thus becomes possible to release heat to the heat sink without causing inhomogeneous heat generation.

Also, by incorporating a shunt resister and a snubber capacitor, which are heating bodies, heat is generated in and released from the shunt resister and the snubber capacitor efficiently in a good balance as with the semiconductor switching elements.

In addition, because heat is released from the constituent components in a good balance, temperature rises in the components are balanced and heat does not concentrate in an individual component. Hence, deterioration of performance for heat generation is suppressed and a drive ability as an electric power steering drive control apparatus is enhanced. According to the invention, by exploiting heat resistance performance for individual components to the limit in a good balance, it becomes possible to select necessary and sufficient components, which in turn makes it possible to achieve a size reduction and a cost reduction.

MODE FOR CARRYING OUT THE INVENTION

First Embodiment

Figure 1:
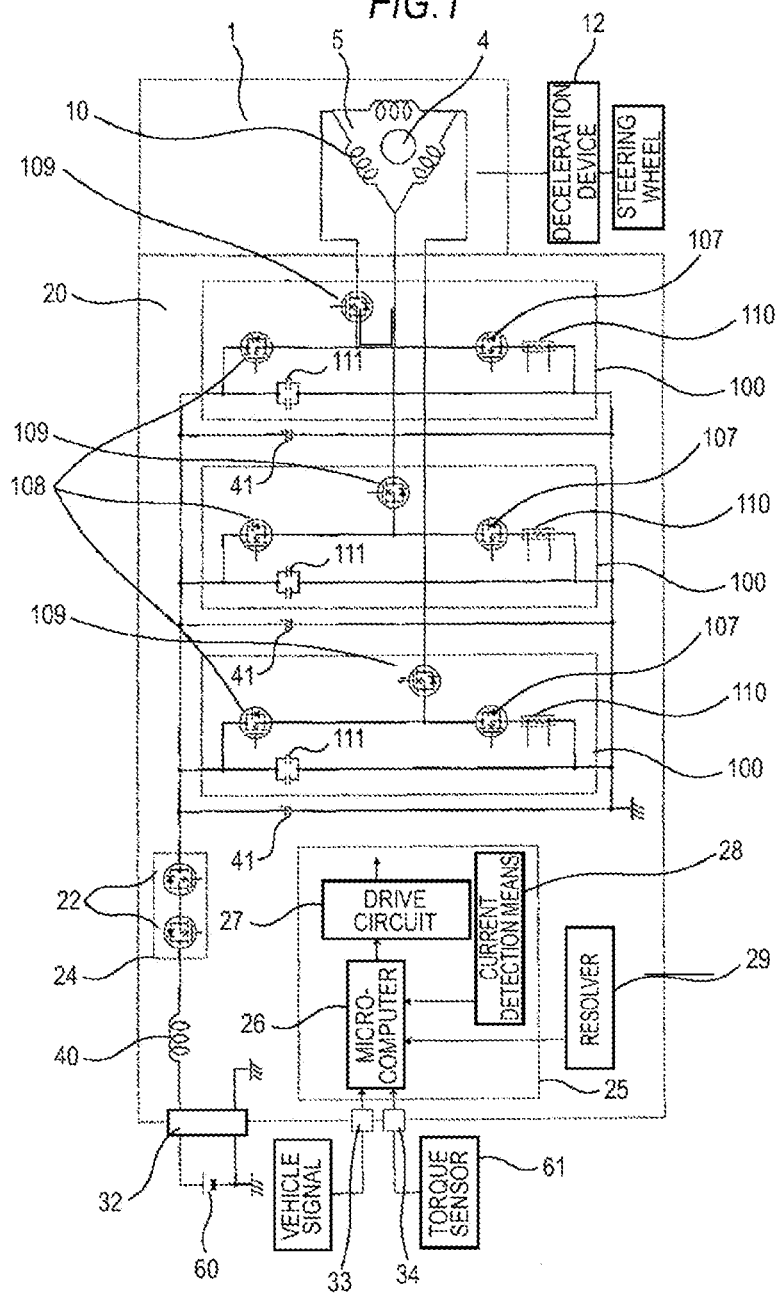
FIG. 1 is a block circuit diagram showing an overall configuration of an electric power steering drive control apparatus according to a first embodiment of the invention.

Hereinafter, one embodiment of the invention will be described according to the drawings. A description will be given by labeling same or equivalent members or portions with same reference numerals in the respective drawings.

FIG. 1 is a block circuit diagram showing an overall configuration of an electric power steering drive control apparatus according to a first embodiment of the invention. This drive control apparatus includes an electric motor 1 outputting an assist torque to a steering wheel of a vehicle, a control device 20 controlling the driving of the electric motor 1, a reduction gear 12 decreasing a rotation speed of the electric motor 1, a battery 60 supplying a current to drive the electric motor 1, and a torque sensor 61 detecting a steering torque of the steering wheel (not shown). Also, this drive control apparatus includes a power connector 32 electrically connecting the battery 60 and the control device 20, a vehicle-side signal connector 33 in which to input a vehicle signal, such as a vehicle running speed signal from the vehicle, and a torque sensor connector 34 electrically connecting the torque sensor 61 and the control device 20. Also, the electric motor 1 is a three-phase brushless motor and includes a rotor 4 and a stator 5 provided with an armature winding 10 formed of a phase U, a phase V, and a phase W.

The control device 20 includes large-capacity capacitors 41 (about 2200 µF×3) used to absorb a ripple component of a motor current IM flowing through the electric motor 1, snubber capacitors 111 to prevent an EMI, such as a high-frequency noise, shunt resistors 110 used to detect the motor current IM, power switching elements 107 and 108 forming a three-phase bridge circuit that switches the motor current IM depending on magnitude and a direction of an assist torque, motor relay switching elements 109 inserted to power supply lines of the respective phases of the motor 1 from a plurality of the power switching elements 107 and 108 forming the bridge circuit, a coil 40 preventing an electromagnetic noise generated at switching operations of the semiconductor switching elements 107 and 108 from going outside and becoming a radio noise, and a relay circuit 24 on which are mounted power supply relay semiconductor switching elements 22 serving as a switching means for passing and interrupting a battery current to be supplied from the battery 60 to the bridge circuit. It should be noted that a power module 100 is formed by packaging a power circuit formed of at least the shunt resistor 110, the power switching elements 107 and 108, and the motor relay switching element 109. Likewise, the relay circuit formed of the power supply relay semiconductor switching elements 22 forms a relay module 24.

Also, the control device 20 includes a resolver 29 as a rotation position sensor that detects a rotation position of the rotor 4, a current detection means 28 connected to the shunt resistors 110 for detecting a current flowing through the electric motor 1, a micro-computer 26 computing an assist torque on the basis of a steering torque signal from the torque sensor 61 and also computing a current corresponding to the assist torque by feeding back a motor current detected by the current detection means 28 and a rotation position of the rotor 4 of the electric motor 1 detected by the resolver 29, a drive circuit 27 outputting a drive signal that controls operations of the power switching elements 107 and 108 according to a command from the micro-computer 26, and a control board 25 on which the current detection means 28, the micro-computer 26, and the drive circuit 27 are mounted.

The micro-computer 26 includes a known self-diagnosis function in addition to an A-to-D converter and a PWM timer circuit to constantly make a self-diagnosis as to whether the system is operating normally and interrupts the motor current IM upon occurrence of an abnormality. Steering torque information from the torque sensor 61 and information on the rotation position of the rotor 4 of the electric motor 1 from the resolver 29 are inputted into the micro-computer 26. Also, a running speed signal as one of the vehicle signals is inputted into the micro-computer 26 from the vehicle-side signal connector 33.

Also, the motor current IM is fed back and inputted into the micro-computer 26 by the shunt resistors 110 by way of the current detection means 28. On the basis of these information and signals, the micro-computer 26 generates a rotation direction command and a current control amount corresponding to the assist torque for the power steering, and each drive signal is inputted into the drive circuit 27.

Upon input of the rotation direction command and the current control amount, the drive circuit 27 generates a PWM drive signal and applies this signal to the power switching elements 107 and 108. Consequently, a current from the battery 60 flows through the electric motor 1 by way of the power connector 32, the coil 40, and the semiconductor switching elements 107 through 109. Accordingly, an assist torque in a required amount is outputted to a required direction.

Also, the motor relay switching elements 109 are fail-safe FETs that allow an adequate control current to flow through the electric motor 1 by switching ON the FETs during a normal operation and inhibit a current from passing to the electric motor 1 by switching OFF the FETs in the event of abnormality to prevent an unsafe current from flowing into the electric motor 1. An abnormality is determined by the micro-computer 26.

In this instance, because the detected motor current is fed back to the micro-computer 26 by way of the shunt resistors 110 and the current detection means 28, the motor current IM is controlled to coincide with the motor current command sent from the micro-computer 26 to the drive circuit 27. The motor current IM contains a ripple component due to switching operations of the power switching elements 107 and 108 at the time of the PWM driving. However, the motor current is smoothened and controlled by the large-capacity capacitors 41.

A structure of the electric power steering drive control apparatus described above will now be described according to FIG. 2.

Figure 2:
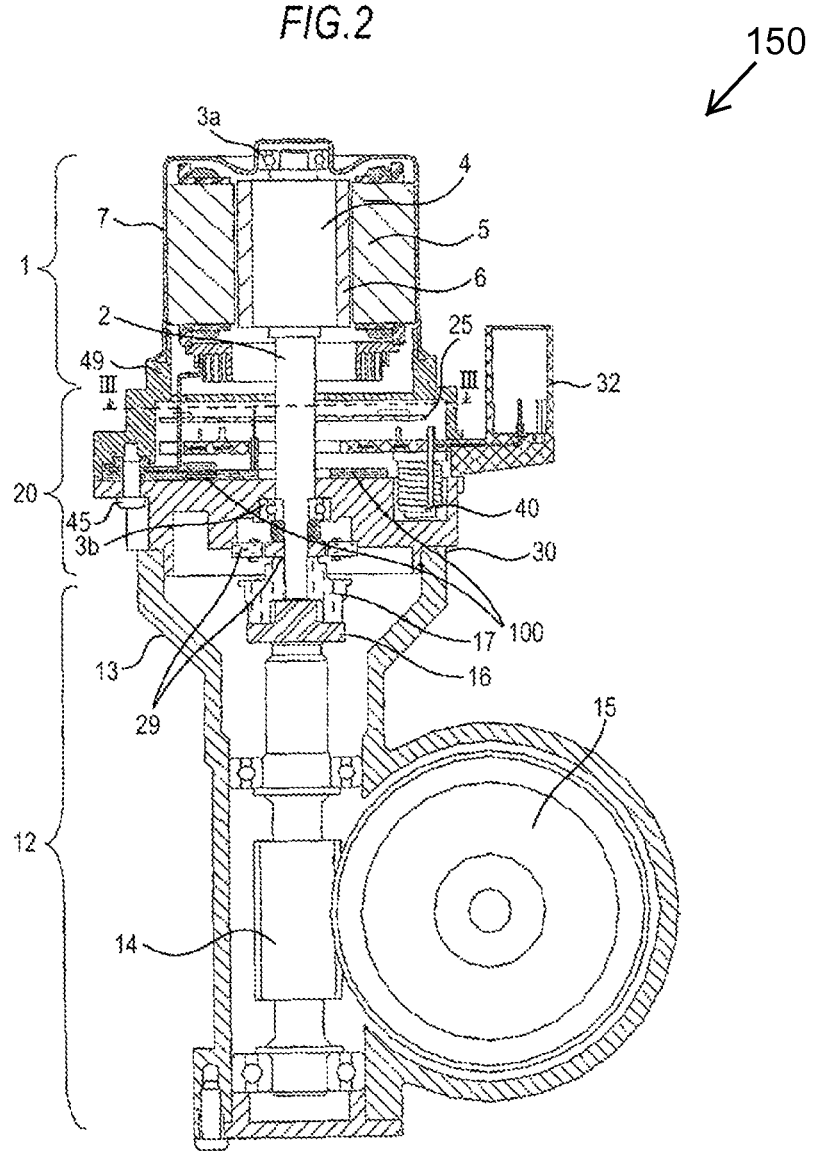
FIG. 2 is a cross section of the electric power steering drive control apparatus according to the first embodiment of the invention.

FIG. 2 is a cross section of the electric power steering drive control apparatus and shows a case where the electric motor 1, the control device 20, and the reduction gear 12 are disposed coaxially with a rotor shaft and the control device 20 is disposed between the electric motor 1 and the reduction gear 12, that is, in front of the rotor shaft.

In the drawing, numeral 150 denotes the electric power steering drive control apparatus, and the drive motor 1 includes the rotor 4 formed of a rotor shaft 2 supported on bearings 3a and 3b in a rotatable manner and a permanent magnet 6 attached around the rotor shaft 2, the stator 5 provided on the periphery of the rotor 4, and an iron yoke 7 used to fix the stator 5.

The control device 20 controlling the driving of the electric motor 1 is formed of the power modules 100, the relay module 24 on which to mount the power supply relay semiconductor switching elements 22 (see FIG. 3 for each component), the control board 25 provided with the microcomputer 26, the drive circuit 27, and the current detection means 28 described above, and a heat sink 30 made of aluminum die cast to which are attached the bearing 3b, the resolver 29, the coil 40 used to remove an electromagnetic noise, and the like.

The reduction gear 12 has a gear case 13 that is a casing in contact with the heat sink 30, a worm gear 14 provided inside of the gear case 13 as means for slowing down rotations of the rotor shaft 2, and a worm wheel 15 meshed with the worm gear 14. A coupling 16 is fixed to the worm gear 14 at an end on the rotor shaft side. By connecting the coupling 16 and a rotor shaft side coupling 17, a torque is transmitted from the electric motor 1 to the worm gear 14.

The control device 20 and a motor housing 49 of the electric motor 1 as heating bodies are fixed to each other with screws 45 and thermally coupled to each other along the entire circumference. In the control device 20, the power modules 100 described below and the relay module 24 are equally disposed in consideration of a thermal balance with respect to the heat sink 30, so that a temperature distribution caused by heat generation is made homogeneous. Also, the heat sink 30 of the control device 20 is fixed to the gear case 13 with screws (not shown) and thermally coupled to each other along the entire circumference. Heat generated from the electric motor 1 and the control device 20 is efficiently released to the gear case 13, too. Hence, temperatures including that of the gear case 13 can be made equal.

Further, it is possible to reduce a thickness or a mass of the heat sink 30 depending on the heat-releasing effect on the gear case 13. By disposing the control device 20 in front of the electric rotor shaft 2, a temperature distribution across the electric motor 1 and the control device 20 as heating bodies can be made homogeneous also in the axial direction. Consequently, a temperature distribution across the entire electric power steering drive control apparatus can be made homogeneous.

Figure 3:
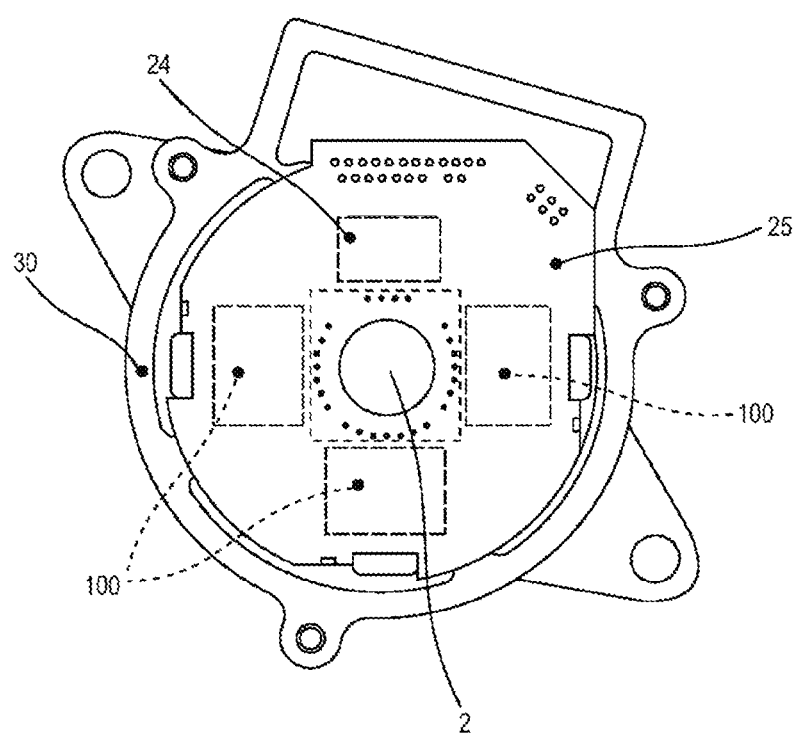
FIG. 3 is a cross section taken on the line III-III of FIG. 2.

FIG. 3 is a cross section taken on the line III-III of FIG. 2. The power modules 100 of three phases are disposed on the heat sink 30 of a circular shape substantially equally in three directions around the rotor shaft 2 on an inner side (in front) of the control board 25. The relay module 24 is disposed in a remaining space around the rotor shaft 2.

By disposing the respective modules in this manner, heat generated in the power modules 100 of three phases and the relay module 24, which are chief heating bodies of the control device 20, is uniformly released to the heat sink 30. Hence, a temperature distribution across the power modules 100, the relay module 24, and the control device 20 can be made homogeneous.

Figure 4:
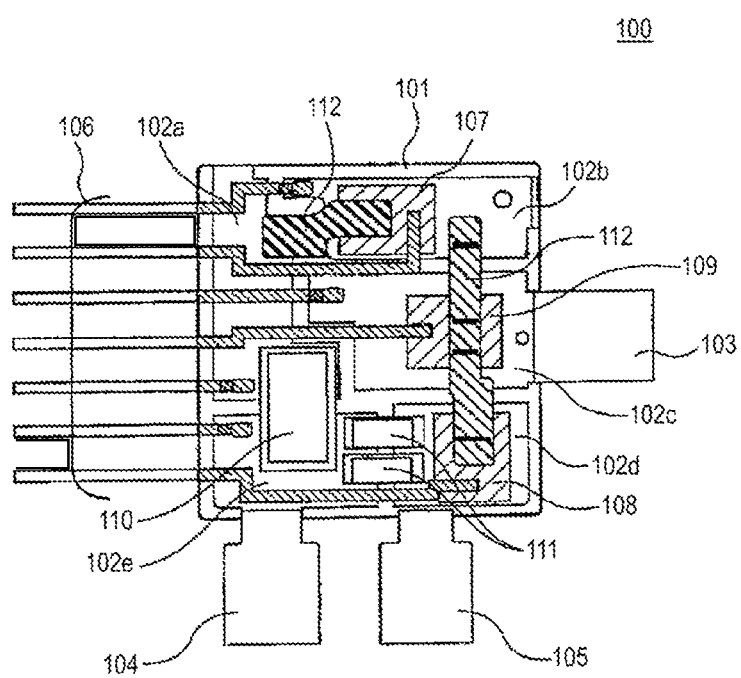
FIG. 4 is a plan view showing a detailed structure of a power module obtained by integrally molding power circuit components and a heat sink using mold resin.
Figure 5:
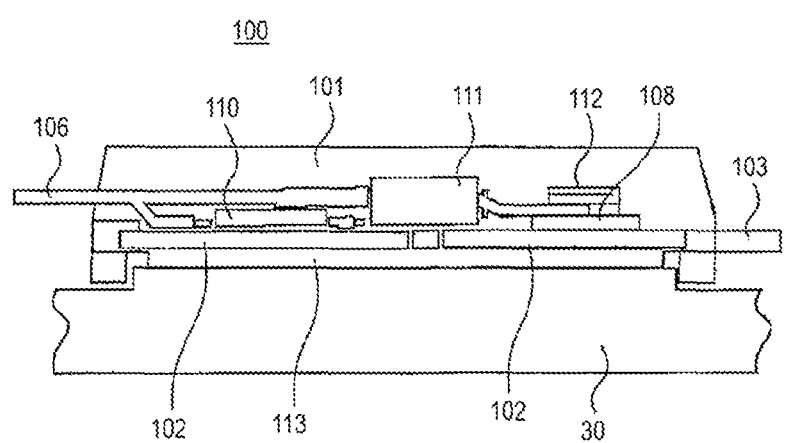
FIG. 5 is an enlarged cross section of the power module of FIG. 4.

FIG. 4 and FIG. 5 are views showing a detailed structure of the power module 100 in which the power circuit components described above and conductive members are integrally molded using mold resin.

Firstly, the power circuit components, that is, FETs formed of the power switching elements 107 and 108 and the motor relay switching element 109, the shunt resister 110, and the snubber capacitor 111 are disposed on base electrodes 102 (102a through 102e) as conductive members and joined by soldering or the like. An upper electrode (not shown) of each FET is joined to another FET or base electrode 102 with a jumper electrode 112 by an unillustrated solder. Meanwhile, control terminals 106 are joined to the base electrodes 102 by unillustrated solders in the same manner as above to extract signals from the gate electrodes of the FETs and the shunt resister 110.

These constituent components are encapsulated with mold resin 101 and a power source terminal 105, a GND terminal 104, a motor output terminal 103, and the control terminal 106 are exposed to the outside. In this manner, a power circuit portion made up of the upper and lower arm FETs 108 and 107, the motor relay FET 109, the shunt resister 110, and the snubber capacitor 111 shown in FIG. 1, together with the base electrodes 102 as the conductive members, is formed as the power module. It should be appreciated that the snubber capacitor 111 may be omitted depending on the conditions of use.

The base electrodes 102 are exposed on one surfaces to a bottom surface of the power module 100 and thermally-coupled to the heat sink 30 via a highly heat conductive material 113 made of silicone resin.

Although it isnot shown herein, protrusions are provided to a part of the resin on the bottom surface side of the power module 100, so that a uniform clearance is formed between the heat sink 30 and the exposed base electrodes 102. This uniform clearance is filled with the silicone resin.

Owing to the configuration above, it becomes possible to efficiently release heat generated from electronic components to the outside. It goes without saying that the silicone resin makes a temperature distribution in a planar direction more homogeneous. Also, it should be appreciated that the highly heat conductive material is not particularly limited to the one made of silicone resin.

As has been described, owing to the integrally molded structure using mold resin and the structure in which silicone resin is interposed between the conductive members exposed on one surfaces and the heat sink, heat from the respective electronic components and the conductive members as heating bodies is made homogeneous inside the power module 100 via the mold resin and the silicone resin; moreover, it becomes possible to release heat uniformly from the bottom surface. Also, because it is possible to avoid a considerable temperature rise from taking place in only one of the constituent components, use efficiency (performance) can be enhanced. Consequently, not only can necessary and sufficient components be selected, but also a size reduction and a cost reduction can be achieved.

In addition, according to this embodiment, by disposing the control device 20 in front of the electric rotor shaftr 2 and by equally disposing the power modules 100 of three phases and the relay module 24 to the heat sink 30 as described above, it becomes possible to release heat quite efficiently from the entire electric power steering drive control apparatus.

In this embodiment, the conductive members are exposed on one surfaces. However, in a case where there is allowance for temperature, the power modules may be covered entirely with the mold resin.

Second Embodiment

A second embodiment is a case where heat-releasing efficiency of the first embodiment above is further improved and will be described in detail using the circuit of FIG. 1.

Firstly, an operation of the electric motor 1 under PWM driving by the control device 20 will be described using FIG. 1. Herein, in a case where the upper arm FETs 108 of the three-phase bridge circuit are ON, a motor current flows through a route starting from the power supply terminal of the battery 60→the upper arm FET 108→the motor relay FET 109→the electric motor 1→the arm of another phase.

On the contrary, in a case where the lower arm FETs 107 are ON, a motor current flows through a route starting from the GND electrode→the shunt resister 110→the lower FET 107→the motor relay FET 109→the electric motor 1→the arm of another phase.

Regarding a time over which the motor current flows through each FET per cycle, the time of the relay FET 109 is twice as long as that of the upper and lower arm FETs 108 and 107 (the time of the upper and lower arms 108 and 107 is half the time of the relay FET 109). Given that ON resistances are equal in all the FETs, then, a power loss ratio is expressed as:

arm FETs 107 and 108: relay FET 109=1:2

Hence, given that heat-releasing efficiencies are equal in all the FETs, then, a temperature rise of the relay FET 109 is twice as great as that of the arm FETs 108 and 107.

In order to solve this problem, the ON resistance of the relay FET 109 is set smaller than that of the arm FETs 107 and 108. It is preferable to set the former to be substantially half the latter in consideration of a thermal balance.

Also, in order to reduce a temperature rise of the motor relay FET 109 generating a large amount of heat, a chip size of the motor relay FET 109 is set larger than that of the upper and lower arms 107 and 108. It is preferable to set the former substantially twice as large as the latter in consideration of heat-releasing efficiency.

Further, in order to decrease a temperature rise of the motor relay FET 109 generating a large amount of heat, heat-releasing efficiency is enhanced by setting an area of the base electrode 102c beneath the motor relay FET 109 larger than that of the base electrodes 102b and 102d of the upper and lower arms. It goes without saying that the base electrodes are also heating bodies but they also play a role of the heat sink partially. By increasing the area, not only can a heat-radiation performance to the heat sink be improved, but also a heat capacity in the vicinity of the FET can be increased. It thus becomes possible to suppress a transitional temperature rise.

As means for increasing a heat capacity, there are methods other than the one using the area of the base electrode, such as a method of increasing the thickness and a method of soldering a separate member, such as copper plate, onto the base electrode in the vicinity of the FET.

Also, the shunt resister 110 is inserted into the upper or lower arm or the motor line to detect a motor current, and the shunt resister 110 is inserted into the lower arm herein. Normally, a shunt resister having a resistance value of about 1 mΩ is used. However, as with the upper and lower arms FETs 108, 107, a power loss caused by passing a current generates heat and it is therefore necessary to release heat efficiently. In FIG. 1, the shunt resister 110 is also incorporated into the power module 100 and formed integrally using the resin 101. Accordingly, as with the FETs described above, it becomes possible to make a temperature distribution homogeneous and release heat efficiently.

The inverter circuit normally drives the motor by the PWM method. In order to reduce a switching loss of the FETs, it is required for the FETs to switch as quickly as possible. In this instance, a high frequency current flows between the upper and lower arms 108 and 107 and the power supply and causes an EMI, such as a radio noise. In order to overcome this inconvenience, there is a measure by which the snubber capacitor 111 with good high frequency characteristics (for example, ceramic capacitor) is inserted in parallel with the upper and lower arms 108 and 107, so that influences of the high frequency current are reduced by circulating the high frequency current between the upper and lower arms 108 and 107 and the snubber capacitor 111. In this case, it is preferable that a physical distance between the upper and lower arms 108 and 107 and the snubber capacitor 111 is short.

In this embodiment, because the snubber capacitor 111 is incorporated into the power module 100, it is possible to efficiently circulate a high frequency current within the module. In other words, many high frequency currents flow through the snubber capacitor 111. Accordingly, the snubber capacitor 111 per se generates considerable heat and a consideration has to be given to the releasing of heat. As with the shunt resister 110, a temperature distribution of the snubber capacitor 111 attached to the base electrodes 102d and 102e is made homogeneous for the same reason as that of the shunt resister 110 and heat can be released efficiently as well. Hence, this embodiment has two benefits: enhancement of EMI performance and enhancement of heat-radiation performance.

Third Embodiment

Figure 6:
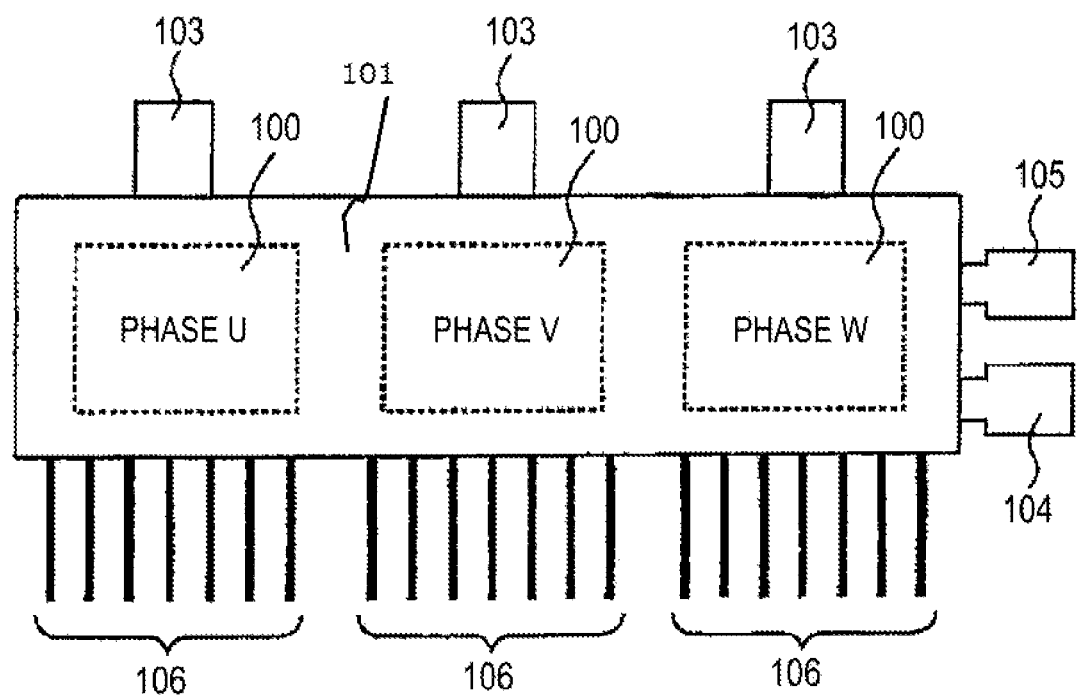
FIG. 6 is a plan view of a power module according to a third embodiment of the invention which is obtained by molding power circuit components of three phases collectively into a same package by resin encapsulation.

The first embodiment above has described a case where abridge arm of one phase forms a single power module. It should be appreciated, however, that bridge arms of three phases may be collectively molded into a same package by resin encapsulation. FIG. 6 shows a power module in this case. In the drawing, same reference numerals as those in FIG. 4 denote the same or equivalent components.

An electric power steering apparatus often employs a three-phase brushless motor. Accordingly, by encapsulating arms of three phases into a single power module 200, as in the first and second embodiments above, an internal temperature distribution can be made homogeneous and a further improvement of heat-releasing efficiency is expected for the arms of three phases as a whole. Also, it goes without saying that a further size reduction of the control device 20 can be achieved by encapsulating the arms of three phases into a single power module.

Fourth Embodiment

Figure 7:
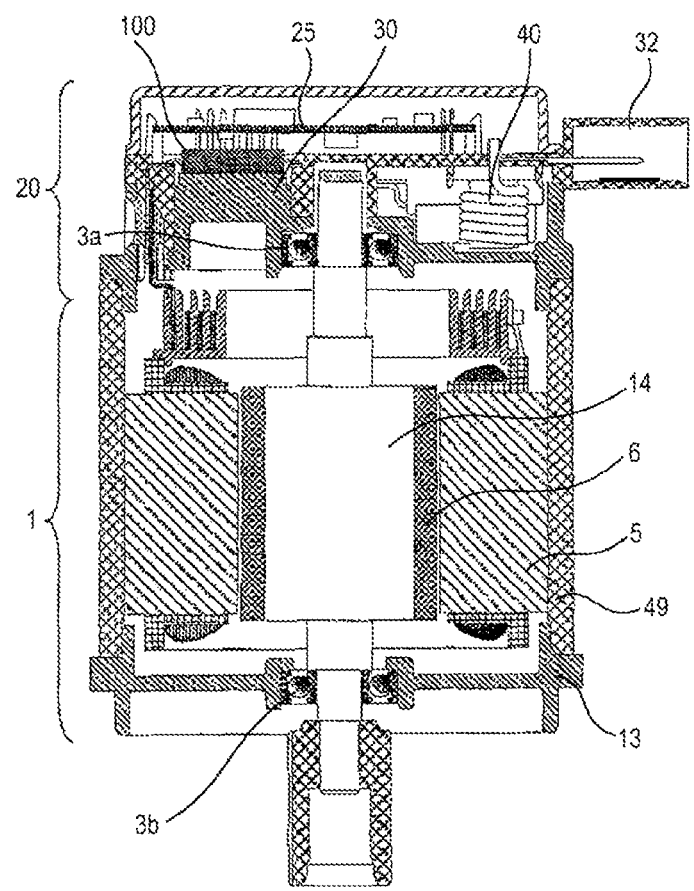
FIG. 7 is a cross section of an electric power steering drive control apparatus according to a fourth embodiment of the invention.

FIG. 7 shows a case where the control device 20 is disposed behind the electric motor 1 coaxially with the rotor shaftr 2.

The electric motor 1 and the heat sink 30 of the control apparatus 20 as heating bodies are fixed to each other with screws (not shown) and thermally coupled to each other along the entire circumference. It should be noted that the control device 20 is disposed behind the electric motor 1 (on a side opposite to the output). In the control device 20, as has been described in the first through third embodiments above, the power modules 100 and the relay module 24 are disposed equally with respect to the heat sink 30 and a temperature distribution caused by heat generation is made homogeneous.

Also, the heat sink 30 of the control device 20 is thermally coupled to the motor housing 49 of the electric motor 1.

Further, the motor housing 49 of the electric motor 1 is screwed to the gear case 13 and the both are thermally coupled to each other along the entire circumference. Heat generated from the electric motor 1 and the control device 20 is also efficiently released to the gear case 13. Hence, temperatures including that of the gear case 13 can be made equal.

In addition, because the motor is exposed to air all along the circumference in the motor housing 49, a high heat conducting characteristic with air is expected. Hence, not only heat generated from the motor, but also heat generated from the control device 20 is released from the motor housing 49 via the heat sink 30.

In this manner, by disposing the control device 20 behind the electric motor 1 coaxially, a temperature distribution across the electric motor 1 and the control device 20 can be made homogeneous. Consequently, a temperature distribution across the entire electric power steering drive control apparatus can be made homogeneous.

The embodiments above have chiefly described the power modules 100. It should be appreciated, however, that the relay module 24 can be of the same thermal design and configuration.

DESCRIPTION OF REFERENCE NUMERALS AND SIGNS

1: electric motor
12: reduction gear
20: control device
24: relay module
30: heat sink
100: power module
101: mold resin
107 and 108: power switching elements
109: motor relay switching element
110: shunt resister
111: snubber capacitor
113: highly heat conductive material

The invention claimed is:

1. A power module for electric power steering, the power module comprising:
conductive members divided into a plurality of pieces;
power circuit components mounted on the conductive members and comprising:
power switching elements forming a bridge circuit, and
a motor relay switching element connected into power lines of respective power switching elements to control ON and OFF states of motor currents to be supplied to an electric motor from the respective power switching elements; and
a power source terminal, a ground (GND) terminal, a motor output terminal, and first control terminals driving each of the power switching elements,
wherein the motor output terminal is integrally exposed from a part of the conductive members while keeping the same plane as the conductive members so that a bottom surface of the motor output terminal is disposed on a same continuous plane as a bottom surface of the part of the conductive members in a straight line,
the power circuit components, the conductive members, and any one or more among the power source terminal, the GND terminal, the motor output terminal, and the first control terminals are integrally molded using mold resin and disposed on a heat sink,
the first control terminals are disposed separately in a first side of the mold resin different from a second side of the mold resin in which the motor output terminal is disposed,
the power circuit components further comprise a current detection shunt resistor electrically connected to second control terminals,
the power source terminal is disposed at a third side of the mold resin that is different from the second side at which the motor output terminal is disposed, and
the first control terminals and the second control terminals are disposed together at the first side of the mold resin different from the third side and the second side.

2. The power module for electric power steering according to claim 1, wherein:
ON resistance of the motor relay switching element is smaller than ON resistance of the power switching elements forming the bridge circuit.

3. The power module for electric power steering according to claim 1, wherein:
a chip size of the motor relay switching element is larger than a chip size of the power switching elements forming the bridge circuit.

4. The power module for electric power steering according to claim 1, wherein:
a heat capacity of a conductive member on which is mounted the motor relay switching element is larger than a heat capacity of conductive members on which are mounted the power switching elements forming the bridge circuit.

5. The power module for electric power steering according to claim 1, wherein the power circuit components further comprise:
at least one noise removing snubber capacitor.

6. The power module for electric power steering according to claim 1, wherein:
the power module is coupled to the heat sink by a highly heat conductive material.

7. The power module for electric power steering according to claim 6, wherein:
the conductive members of the power module have exposed surfaces; and
the power module is coupled to the heat sink by the highly heat conductive material which is disposed between the exposed surfaces and the heat sink.

8. The power module for electric power steering according to claim 1, wherein:
the power circuit components of a large number of phases are collectively molded into a same package by resin encapsulation.

9. An electric power steering drive control apparatus comprising the electric motor and a control device that controls driving of the electric motor, wherein:
the power circuit components forming more than one power module, as set forth in claim 1, are provided on the heat sink in such a manner that heat-releasing efficiency becomes equal.

10. The electric power steering drive control apparatus according to claim 9, wherein:

the electric motor and the control device are disposed coaxially with a rotor shaft; and the control device is disposed in front of the rotor shaft.

11. The electric power steering drive control apparatus according to claim 9, wherein:

the electric motor and the control device are disposed coaxially with a rotor shaft; and the control device is disposed behind the rotor shaft.

12. The power module for electric power steering according to claim 1, wherein the first control terminals and the second control terminals are exposed separately from the GND terminal.

13. The power module for electric power steering according to claim 1, wherein the bridge circuit is formed by the power switching elements connected in series in upper and lower arms, and the motor relay switching element is connected to a point between the power switching elements.

14. The power module for electric power steering according to claim 1, wherein the bridge circuit is formed by the power switching elements connected in series in upper and lower arms, the power source terminal and the GND terminal are disposed in parallel, the power switching element of the upper arm is disposed adjacent to the power source terminal, the current detection shunt resister is disposed adjacent to the GND terminal, and the first control terminals and the second control terminals are disposed separately from the power source terminal and the GND terminal.

15. The power module for electric power steering according to claim 1, wherein the motor relay switching element is connected between the power switching elements and the motor output terminal.

* * * * *